US005153803A

United States Patent [19]

Rapeaux et al.

[11] Patent Number: 5,153,803
[45] Date of Patent: Oct. 6, 1992

[54] CONTACT MAKER-BREAKER

[75] Inventors: Michel Rapeaux, Clamart; Juan Aymami, Nanterre; Jacques Muniesa, Enghien les Bains, all of France

[73] Assignee: Telemecanique, France

[21] Appl. No.: 695,073

[22] Filed: May 3, 1991

[30] Foreign Application Priority Data

May 4, 1990 [FR] France ................ 90 05704

[51] Int. Cl.$^5$ ................ H02H 7/00; H03K 17/92

[52] U.S. Cl. ................ 361/19; 361/141; 307/245; 174/15.4

[58] Field of Search ................ 361/19, 141, 43, 93; 307/245, 306; 174/15.4, 125.1

[56] References Cited

U.S. PATENT DOCUMENTS 3,270,247 8/1966 Rosner ................ 317/16
4,486,800 12/1984 Franksen ................ 361/19
4,807,084 2/1989 Takechi ................ 361/141
4,910,626 3/1990 Collet et al. ................ 361/19

*Primary Examiner*—Steven L. Stephan
*Assistant Examiner*—Matthew Nguyen
*Attorney, Agent, or Firm*—William A. Drucker

[57] ABSTRACT

A contact maker-breaker is disclosed in which the power contacts are associated in series with a superconducting element which is controlled by a heating element and which is structured so as to have a very high resistance following its controlled transition from the superconducting state to the normal state in response to a closing or opening order or following its intrinsic transition from the superconducting state to the normal state in response to a fault current, so that closing and opening of the power contacts takes place on the same leak current of a very low value.

5 Claims, 4 Drawing Sheets

CONTACT MAKER-BREAKER

BACKGROUND OF THE INVENTION

The present invention relates to an electric apparatus of the contact maker-breaker kind using the same power contacts for both the make and break functions.

Such electric apparatus of the contact maker-breaker kind are well known and comprise for example:

at least one pole with separable contacts, called power contacts;

an electromagnet having a coil adapted to be fed by current pulses forming closing and opening orders generated in response to the actuation of a manual control member, and a mobile armature to which a control mechanism is coupled, this control mechanism being adapted for closing and opening the contacts as a function of the order transmitted to the coil;

an automatic tripping device associated with said pole and causing the contacts to open following the detection of a short circuit;

a quenching device associated with each cut-off chamber.

In such apparatus which combine the "contact maker" function and the "contact breaker" function, a current limitation function is integrated solely with the "contact breaker" function, which function is fulfilled for example by a magnetic striker on each pole, for protecting the contacts at the time of a short circuit.

Now, since such apparatus use the same contacts for the "contact maker" function and the "contact breaker" function, it is also desirable to protect the contacts when they are controlled by the electromagnet so as to prevent in particular any possible appearance of the known phenomenon of bounce during closing of the contacts.

The object of the invention is to provide an electric apparatus of the contact maker-breaker kind using the same power contacts for the contact maker and contact breaker functions, which provides excellent protection, in a simple way, of the contacts not only during closing or opening by manual control, but also during automatic tripping on a fault.

For this, the basic idea of the contact maker-breaker according to the invention resides in the fact that the power contacts are associated in series with a superconducting element which is controlled thermally and structured so as to have a very high resistance following its controlled transition from the superconducting state to the normal state in response to a closing or opening order or following its intrinsic transition from the superconducting state to the normal state in response to a fault current, so that the contacts close and open on the same so-called leak current, of very low value.

The result of this leak current is advantageously that no electric arc is then likely to occur between the contacts, which makes it possible henceforth to omit any arc quenching structure, contrary to the prior art.

SUMMARY OF THE INVENTION

The object of the invention is then to provide a contact maker-breaker, characterized in that it comprises:

at least one polar path comprising a pair of cooperating so-called power contacts in series with a superconducting element placed in a sealed enclosure filled with gas, said enclosure being immersed in a thermostat-controlled medium controlled to a temperature lower than the critical temperature of the superconducting element;

electric control means coupled to a manual control member and adapted for delivering a logic control signal comprising closing and opening orders;

a heating element, placed in the sealed enclosure and electrically isolated from the superconducting element, receiving the logic control signal and transmitting heat to the superconducting element both on a closing order and on an opening order for increasing the temperature thereof above its critical temperature thus causing transition of the superconducting element from the superconducting state to the normal state, said superconducting element being structured so as to have a high resistance after such transition;

a bistable electromagnetic control device receiving the logic control signal and actuating the power contacts in their closing direction in response to a closing order or in their opening direction in response to an opening order, with a reaction time greater than that causing transition from the superconducting state to the normal state of the superconducting element, following such closing or opening order;

detection means for automatically detecting a fault current connected in parallel with the superconducting element, which element is adapted for transiting intrinsically from the superconducting state to the normal state in the presence of the fault current flowing therethrough;

delayed electric control means coupled to the detection means and adapted for delivering, after a delay time at least equal to that of the closing order, a fault current pulse which is transmitted both to the heating element transmitting heat to the superconducting element switched intrinsically to the normal state so as to increase the resistance thereof and to the bistable electromagnetic control device actuating the power contacts in their opening direction at the end of the pulse.

BRIEF DESCRIPTION OF THE DRAWINGS

Other features and advantages of the invention will be clear from the detailed description which follows with reference to the accompanying drawings given solely by way of example and in which.

DESCRIPTION OF THE PREFERRED EMBODIMENTS

Figure 1:
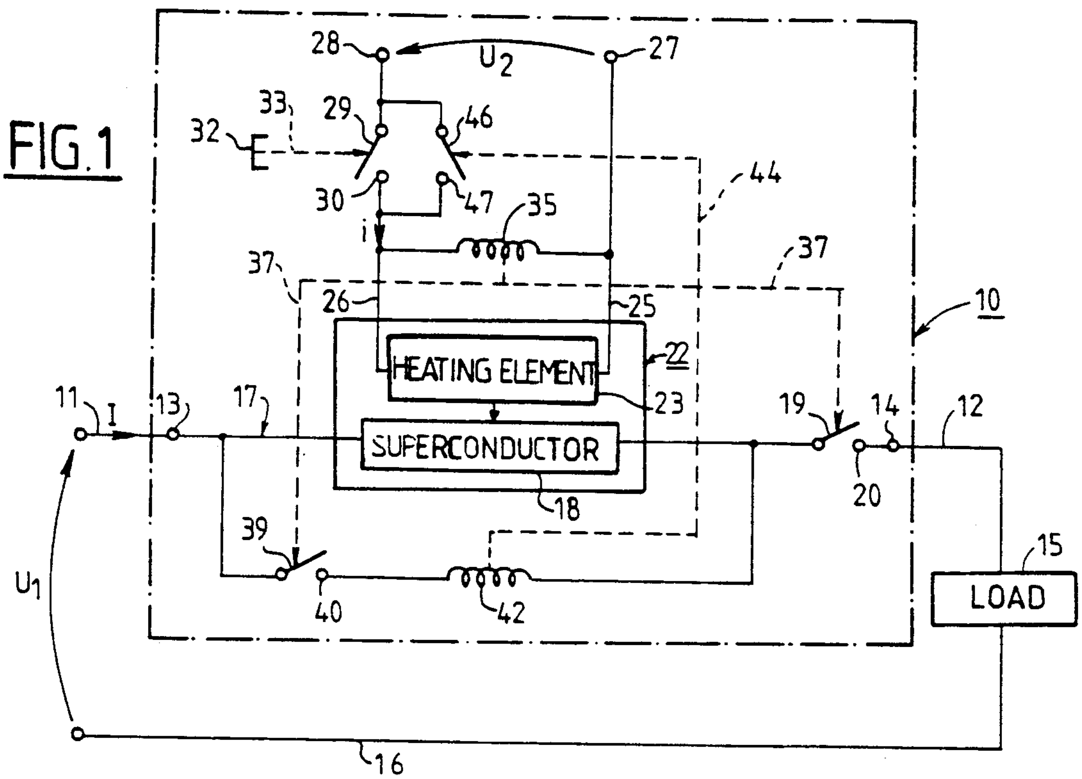
FIG. 1 is a simplified electric diagram of one embodiment of the contact maker-breaker of the invention.

FIG. 1 is a simplified electric diagram of a contact maker-breaker according to the invention, designated by the general reference 10, which is shown here in the single pole version, it being of course also possible to provide a multipole version.

The contact maker-breaker 10, FIG. 1, comprises an input conductor 11 and and output conductor 12 connected respectively to two power terminals 13, 14; it is inserted in series with a load 15 in a main electric line 16 fed by a voltage $U_1$.

The polar path 17 comprises, between the two power terminals 13, 14, a series circuit formed of a superconducting element 18 and a pair of separable power contacts 19–20, one of which (19) is movable and the other of which (20) is fixed.

In FIG. 1, a current switching device has been designated as a whole at 22 and comprising the superconducting element 18 controlled by a heating element 23; the construction and role of this switching device 22 will be described in detail further on.

The heating element 23 of the switching device 22, FIG. 1, is connected between two electric conductors 25, 26 one (25) of which is connected directly to a first control terminal 27 and the other (26) of which is connected to a second control terminal 28 via a pair of separable contacts 29–30 urged in the closing direction by actuation of a manual control member 32, such for example as a push-button, via a control mechanism shown schematically at 33, for generating in the closed position a current pulse, for example of logic level 1, feeding the heating element 23 and forming either a closing order or an opening order; a voltage $U_2$ is applied between the two control terminals 27, 28.

As will be explained further on, when the heating element 23 has a control current i flowing through it corresponding to a closing or opening order given in response to actuation of button 32, it transmits heat to the superconducting element 18 for bringing the temperature thereof above its critical temperature, thus causing transition of the superconducting material from the superconducting state to the normal state.

In FIG. 1, a bistable coil 35 is connected in parallel across the heating element 23 and is energized, while changing stable state, by means of a current pulse forming one of the two orders—closing or opening—given in response to actuation of button 32; it is energized until the current pulse forming the other order appears, then changing stable state.

The bistable coil 35 belongs to an electromagnet (not shown) of a type known per se, comprising a movable magnetic circuit associated with a control mechanism shown schematically at 37 in FIG. 1 and urging the power contacts 19–20 either in the closing direction when coil 35 is energized following an order for closing by manual control, or in the opening direction when coil 35 is deenergized at the moment when the manually controlled opening order appears.

So that the power contacts 19–20 do not close and open, following the manual control, on the current of use for which the superconducting element 18 is in the superconducting state, the electromagnet (comprising the bistable coil 35) and its control mechanism 37 are adapted so that the switching time of the power contacts 19–20 is greater than the time for transition of the superconducting material from the superconducting state to the normal state following the closing and opening orders given by manual control.

As shown in FIG. 1, a series circuit formed of a pair of separable contacts 39–40 and a coil 42 is connected in parallel across the superconducting element 18, the contacts 39–40 being located on the input conductor 11 side.

Contacts 39–40 are urged simultaneously with the contacts 19–20 in the closing direction or in the opening direction by the same control mechanism 37 associated with the electromagnet comprising the bistable coil 35.

Coil 42 belongs to an electromagnet (not shown) of a type known per se, comprising a mobile magnetic circuit associated with a control mechanism shown schematically at 44 in FIG. 1 and urging a pair of time delayed contacts 46–47 connected in parallel across the contacts 39–40 solely in the closing direction and after a pre-defined fault duration, when coil 42 is energized by a fault current. As will be seen further on, coil 42 plays as it were the role of means for automatically detecting a fault current; moreover, the time delay of contacts 46–47 is determined so that it is at least equal to the duration of the closing order given in response to actuation of button 32. In the closed position, following a fault, the contacts 46–47 deliver a fault current pulse, for example of logic level 1, which is fed both to the heating element 23 and the bistable coil 35.

Figure 2:
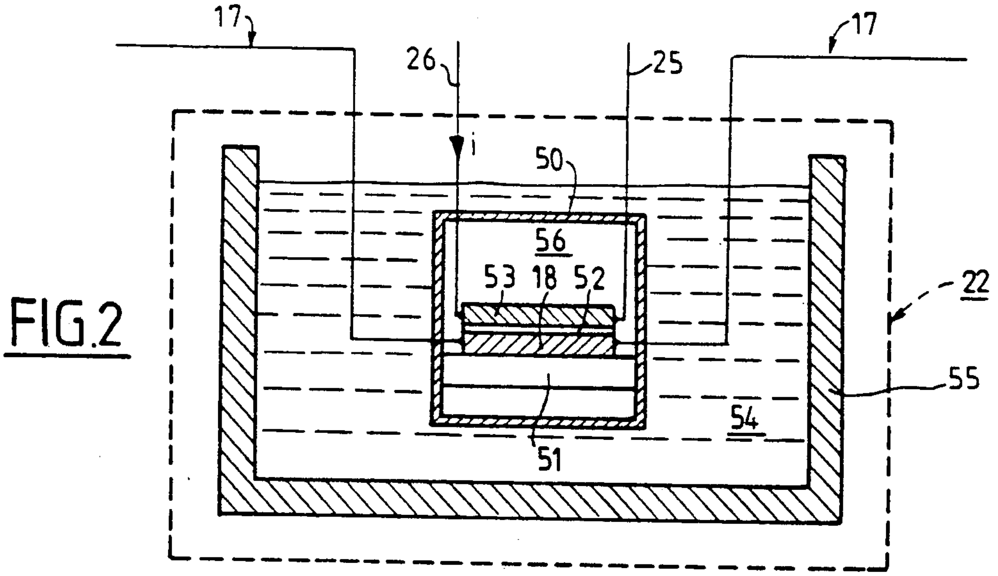
FIGS. 2, 3 and 4 are schematic sectional views illustrating respectively three embodiments of the superconducting switching device of FIG. 1.
Figure 3:
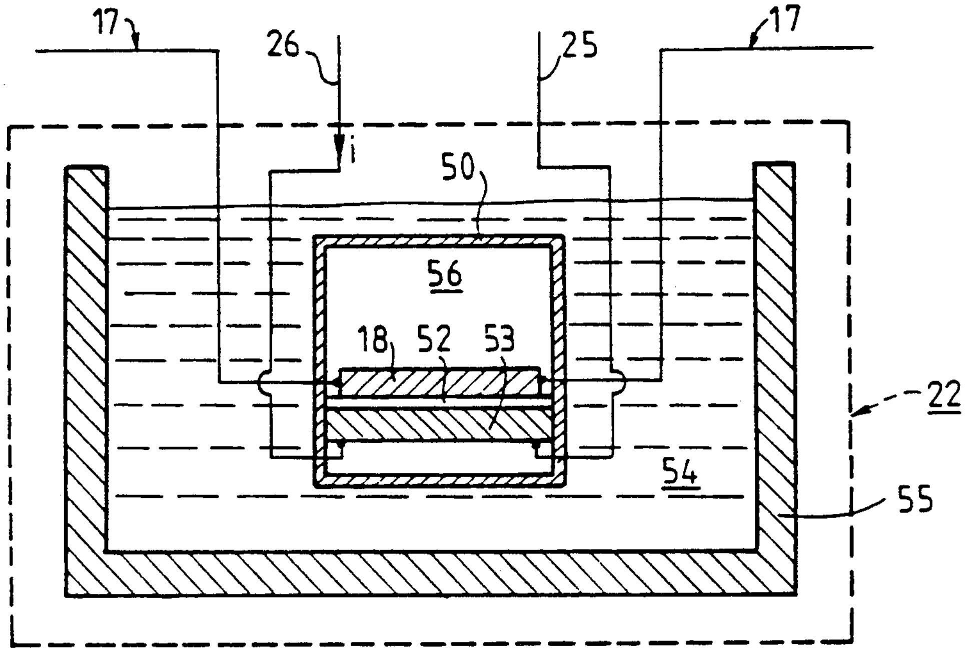
Figure 4:
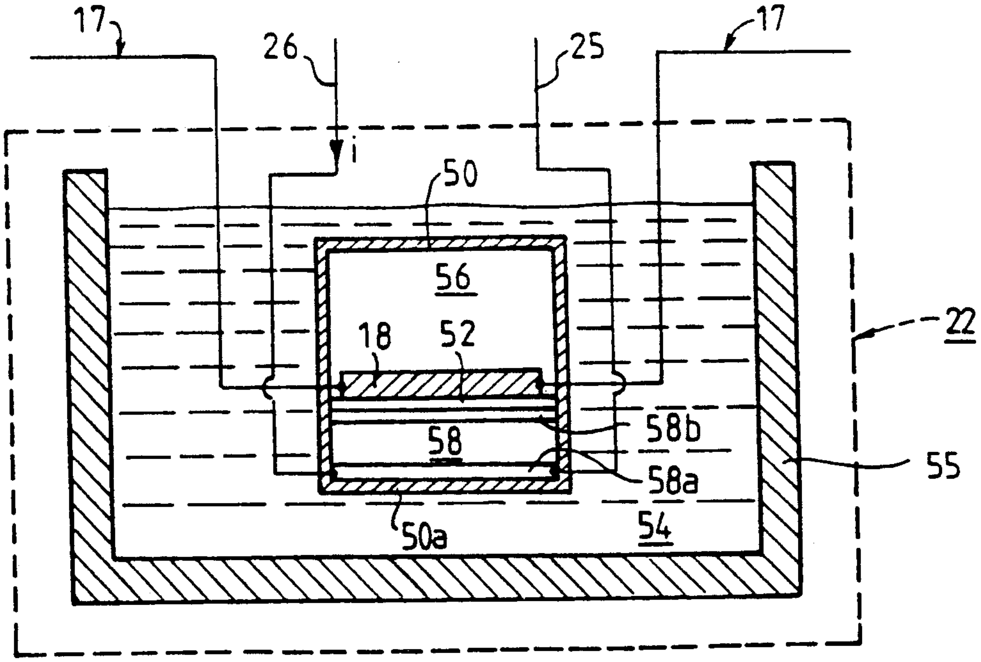

Referring to FIGS. 2, 3 and 4 in which the identical elements bear the same references, the construction of the current switching device 22 of FIG. 1 will now be described in detail.

In the embodiment illustrated in FIG. 2, this device 22 comprises a sealed enclosure 50 inside which are disposed three flat layers superimposed on a substrate 51, namely: a superconducting layer 18, a dielectric layer 52, made for example from zirconium, of a small thickness of a few microns, and a resistive layer 53 made here from metal, for example silver or nickel, serving as heating element (23, FIG. 1), in this case an electric resistance. A thin arresting layer (not shown) may be inserted between substrate 51 and the superconducting layer 18.

The sealed enclosure 50 is immersed in a thermostat-controlled medium 54 contained in a container 55 and formed for example by liquid nitrogen or by any other liquid gas of a temperature less than the critical temperature of the superconducting material 18. By way of non limitative illustration, the superconducting material is a perovskite of type $Y_1\,Ba_2\,Cu_3\,O_{7-x}$ whose critical temperature $T_c$ is close to 92K, the thermostat-controlled medium 54 then being liquid nitrogen (boiling temperature equal to 77.3K at atmospheric pressure). The superconducting layer 18 is inserted in the polar path 17 via sealed isolating passages (not shown), whereas the resistive layer 53 is inserted between the two conductors 25, 26 via sealed isolating passages (not shown. The dielectric layer 52 inserted between the superconducting 18 and resistive 53 layers then provides the electric insulation between the power portion and the control portion.

The sealed enclosure 50 is moreover filled with a gas 56, such for example as nitrogen, helium or else dry air, which remains in the gas state at the temperature of the thermostat-controlled medium 54. Since the sealed enclosure 50 containing the superconducting layer 18 bathes in the thermostat-controlled medium 54, the gas 56 then serves among other things for thermally isolating the superconducting material so that during heating thereof by the resistive layer 53 through which the control current i flows, the energy losses to the thermostat-controlled medium are very low.

In the variant illustrated in FIG. 3, the resistive layer 53 serving as heating element is formed by a substrate of an appropriate material, for example doped silicon, from which the layers, respectively dielectric 52 and superconducting 18 are formed.

It should be noted that without departing from the spirit of the invention, on the one hand, the three respectively superconducting 18, dielectric 52 and resistive 53 layers may form a wire structure and, on the other hand, in this case as well as in the case of a stacked structure of these three layers as illustrated in particular in FIG. 2, the two respectively superconducting 18 and resistive 53 layers may be reversed.

In the embodiment illustrated in FIG. 4, a Peltier effect module is provided, which is known per se and which is shown schematically at 58 in FIG. 4, for playing the role of heating element 23 in FIG. 1. This Peltier effect module 58, FIG. 4 has a first flat face 58*a* called cold face, applied against a flat wall 50*a* of enclosure 50 here made from metal, such for example as copper, and a second flat face 58*b*, called hot face, for example made from copper, disposed in thermal contact with the superconducting layer 18 via the dielectric layer 52.

In a variant, the cold face, made for example from copper, of the Peltier effect module may form one of the external walls of the enclosure 50 and thus be directly in contact with the thermostat-controlled medium 54; in this case, enclosure 50 does not need to be made from metal.

In these embodiments illustrated in FIGS. 2, 3 and 4, the heating element used, namely an electric resistance 53 (FIGS. 2 and 3) or a Peltier effect module 58 (FIG. 4), when it is fed by a control current pulse corresponding to a manually controlled opening or closing order, increases the temperature of the superconducting layer 18 above its critical temperature, thus causing the transition of the superconducting material from the superconducting state to the normal state.

So that this transition of the superconducting material is rapid, it is necessary on the one hand to work with transitory conditions and on the other had to structure the superconducting material so that it has a product mc (m being its mass and c its heat capacity) which is the lowest possible. In addition, since the gas 56 (FIGS. 2, 3 and 4) contained in the sealed enclosure 50 has a low thermal mass, it contributes appreciably to the rapid transition from the superconducting state to the normal state of the superconducting material.

Furthermore, the superconducting element 18 is adapted to transit intrinsically from the superconducting state to the normal state when the value of a fault current flowing through it is at least equal to that of its critical current $I_c$ defined by $I_c=J_cS$ where $J_c$ is the critical current density dependent on the nature of the superconducting material and S the cross section of the superconducting element. From this critical current value, the superconducting element behaves as a passive current limiter with a so-called intrinsic limitation current value $I_{LI}=I_c=J_cS$ which then depends on the nature and geometry of the superconducting element.

Solely by way of example, using a superconducting material of type $Y_1Ba_2Cu_3O_{7-x}$ whose current density $J_c$ is equal to $10^6$ A/cm$^2$, it is possible to obtain an intrinsic limitation current value $I_{LI}$100A by dimensioning the superconducting element, for example in the case where the latter is flat with a cross section S=hl where h and 1 are respectively its thickness and its width, so that $S=10^{-4}$ cm$^2$, namely for example h=50 microns and 1=200 microns.

The superconducting element 18 is also adapted for introducing into the main line 16 (FIG. 1), following its controlled transition from the superconducting state to the normal state by action of the heating element 23 in the case of manual control or following its intrinsic transition from the superconducting state to the normal state in the case of a fault, a high resistance, referenced $R_{LC}$, such that the current to be established at the time of manually controlled closure of the power contacts 19-20 or to be cut off during manually controlled opening or at the time of automatic opening (in the case of a fault) of these contacts, is very much less than the current of use $I_E$; this current, referenced $I_{LC}$ and called leak current is equal to $I_{LC}$ $U_1/R_{LC}$ (assuming that the impedance of load 15 is appreciably less than resistance $R_{LC}$).

With resistance $R_{LC}$ defined by $R_{LC}=P_{LC}.L/S$, where $P_{LC}$ is the resistivity of element 18 in the normal state, L and S respectively the length and the cross section of element 18, the leak current $I_{LC}$ is then equal to:

$$I_{LC} = U_1 \cdot \frac{S}{P_{LC}L}$$

and therefore depends also on the nature and geometry of the superconducting element.

Taking again the example chosen above, the resistivity of the type of material chosen above in the normal state $P_{LC}$ is equal to $10^{-3}$ ohm.cm, so that for a length L of the superconducting element equal for example to 4 m and for a supply voltage $U_1$400V, the cross section S being equal to $10^{-4}$ cm$^2$, a leak current value $I_{LC}$=0-.1A is obtained.

The operation of the contact maker-breaker 10 of FIG. 1 is the following:

First of all, on a closing order given by button 32, contacts 29-30 close and deliver a so-called closing pulse $I_f$(FIG. 5) which is transmitted both to the heating element 23 and to the bistable coil 35.

In the case where the heating element is formed by the electric resistance 53 illustrated in FIGS. 2 and 3, the passage of this same current pulse $I_f$ (FIG. 6) through the resistive layer 53 transmits heat to the superconducting element 18, which heats up and rapidly reaches the critical temperature $T_c$ at which the material transits from the superconducting state to the normal state, after a very short time $t_{RS}$ (FIG. 7); the resistance of element 18 then increases considerably, taking on the value $R_{LC}$ (FIG. 7) and remaining at this value until the end of the current pulse $I_f$.

In the case where the heating element is formed by the Peltier effect module 58 illustrated in FIG. 4, the passage of the current pulse $I_f$ through the Peltier effect module causes the temperature of its hot face 58*b* to rise, which brings the temperature of the superconducting material 18 rapidly above the critical temperature $T_c$ thus allowing transition from the superconducting state to the normal state to take place, after time $t_{RS}$ (FIG. 7); the resistance of element 18 then increases considerably, taking on the value $R_{LC}$ (FIG. 7) and remaining at this value until the end of the current pulse $I_f$.

It should be noted that controlled heating of the superconducting element 18 is made possible in the present case through the sealed enclosure 50 which isolates the superconducting material 18 from the thermostat-controlled medium 54.

Figures 5, 6, 7, 8, 9:
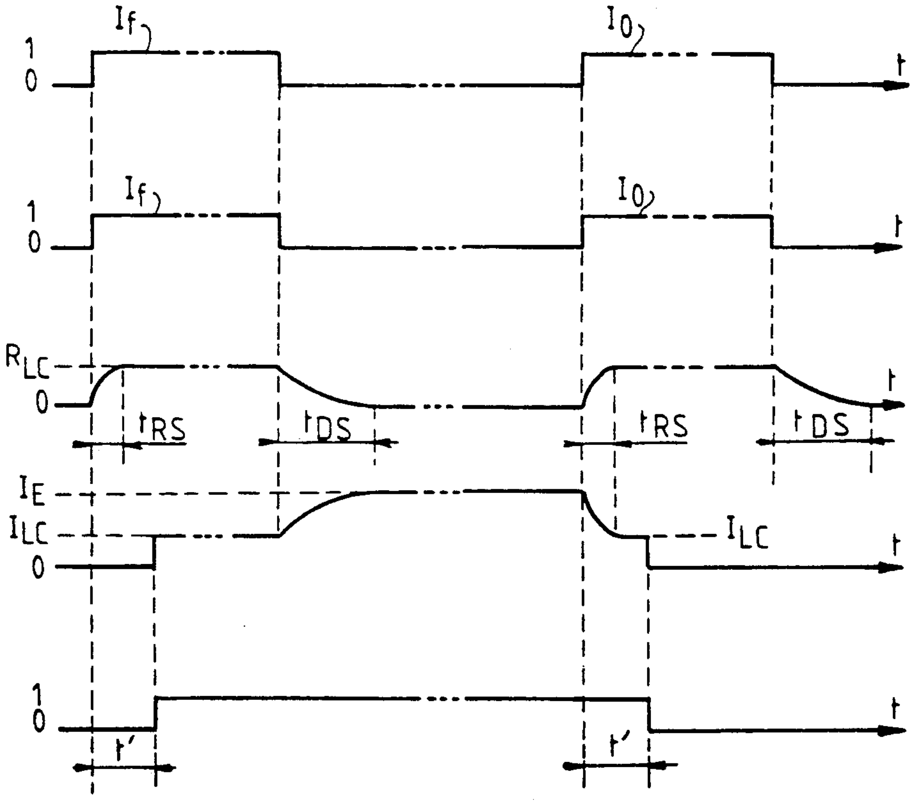
FIGS. 5 to 9 are timing diagrams explaining the diagram of FIG. 1 in relation with a closing order and an opening order (contact maker mode)

With the superconducting element 18 in the normal state, the bistable coil 35 energized by the current pulse $I_f$ causes the simultaneous actuation of the contacts 19-20 and of contacts 39-40 in the closing direction thereof, via the control mechanism 37. Since the switching time of these contacts 19-20 and 39-40 referenced t' in FIG. 9, is greater than the transition time $t_{RS}$ of the superconducting element 18, the contacts 19-20 and contacts 39–40 close. Since coil 42 is adapted to the voltage $U_1$ and the leg comprising contacts 39–40 and coil 42 is adapted to have a resistance appreciably greater than $R_{LC}$, the closure (see FIG. 9) of the contacts 19–20 then takes place on the leak current $I_{LC}$ (FIG. 8) which has a value equal to 0.1A in the above chosen example.

Since coil 35 is of the bistable type, contacts 19–20 and 39–40 then remain closed in the absence of any control current.

Furthermore, since the time delay of contacts 46–47 is greater than the duration of the current pulse $I_f$, they remain in the open position.

At the end of the current pulse $I_f$, contacts 29–30 open and the heating element is no longer supplied so that the superconducting element 18 transits from the normal state to the superconducting state, after a time $t_{DS}$ (FIG. 7).

In the case where the heating element is formed by the electric resistance 53 shown in FIGS. 2 and 3, element 18 returns to the superconducting state by a simple heat exchange between it and the thermostat-controlled medium 54 via the gas 56 contained in enclosure 50.

If the Peltier effect module 58 (FIG. 4) is used, element 18 comes back to the superconducting state by cooling of the hot face 58*b* of module 58 which is obtained by reversing the current in said module for a given time.

When element 18 returns to the superconducting state, current I in the electric line 16 increases and reaches its value of use $I_E$.

On an opening order given by button 32, contacts 29-30 close and deliver a so-called opening current pulse $I_O$ (FIG. 5) which is transmitted to the heating element 23 and to the bistable coil 35.

The transition of the superconducting element 18 from the superconducting state to the normal state controlled by increasing its temperature above its critical temperature by passage of the current pulse $I_O$ through the heating element takes place similarly to what has been described above, depending on whether the heating element is an electric resistance or a Peltier effect module.

Following such transition of the superconducting element, the resistance thereof takes on the value $R_{LC}$ which limits the current of use $I_E$ to the value of the leak current $I_{LC}$.

Since the bistable coil 35 receives the current pulse $I_O$ it is then de-energized, which causes the simultaneous actuation of the contacts 19–20 and of contacts 39–40 in the opening direction thereof, via the control mechanism 37, with a switching time t' (FIG. 9) greater than the transition time $t_{RS}$ of the superconducting element 18. Then the contacts 19–20 open (see FIG. 9) on the leak current $I_{LC}$ (FIG. 8), contacts 39–40 opening simultaneously on a smaller current.

At the end of the current pulse $I_O$, contacts 29–30 open and, after time $t_{DS}$ (FIG. 7), element 18 returns to the superconducting state in a way similar to that described above, depending on whether an electric resistance or a Peltier effect module is used.

Figures 10, 11, 12, 13, 14:
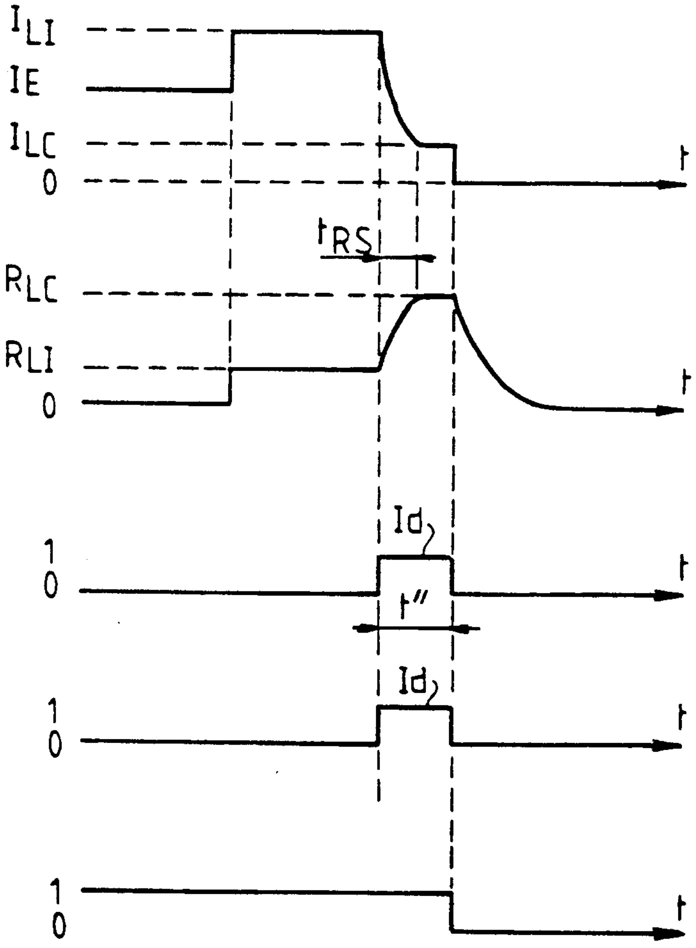
FIGS. 10 to 14 are timing diagrams explaining the diagram of FIG. 1 in relation to a fault (contact breaker mode).

When a fault current appears in the electric line 16, such a current passing through the superconducting element 18 and having an intensity at least equal to the intensity of the critical current of element 18, this latter then transits intrinsically from the superconducting state to the normal state and behaves as a passive current limiter .with an intrinsic limitation current value $I_{LI}$ (FIG. 10), equal to 100 A in the example chosen above; it then introduces into the electric line a resistance referenced $R_{LI}$ in FIG. 11.

In the presence of this fault current, practically the whole of the supply voltage $U_1$ appears at the terminals of element 18 so that, with contacts 39–40 in the closed position, coil 42 in parallel across element 18 is also supplied with power; under these conditions, coil 42 causes closure of the time delayed contacts 46–47 via the control mechanism 44. Contacts 46–47 in the closed position deliver a fault current pulse $I_d$ (FIG. 12) of a duration t'' greater than $t_{RS}$ which is transmitted both to the heating element 23 and to the bistable coil 35.

The heating element (electric resistance 53, FIGS. 2 and 3 or Peltier effect module 58, FIG. 4), fed by this current pulse $I_d$ (FIG. 13), heats element 18 whose resistance $R_{LI}$ increases and after the time $t_{RS}$ reaches the value $R_{LC}$ (FIG. 11), so that the value of the intrinsic limitation current $I_{LI}$ drops to the value of the leak current $I_{LC}$ (FIG. 10), equal to 0.1 A in the above chosen example.

The bistable coil 35 receiving the fault current pulse $I_d$ is again de-energized and changes state after the duration t'' of said pulse, which causes the automatic opening (see FIG. 14) both of the contacts 19–20 and of contacts 39–40, via the control mechanism 37, on the leak current $I_{LC}$ (FIG. 10).

After automatic opening of contacts 19–20 and contacts 39–40, coil 42 is no longer supplied with power, so that at the end of the current pulse $I_d$, contacts 46–47 open and the element 18 returns to the superconducting state similarly to what was described above, depending on whether an electric resistance or a Peltier effect module is used.

What is claimed is:

1. A contact maker-breaker, comprising:

at least one polar path comprising a pair of power contacts which are relatively movable one with respect to the other, either to a closed position or to an open position in series with a superconducting element placed in a sealed enclosure filled with gas, said enclosure being immersed in a thermostat-controlled medium controlled to a temperature lower than the critical temperature of the superconducting element;

electrical control means coupled to a manual control member and adapted for delivering a logic control pulse;

a heat element, placed in the sealed enclosure and electrically isolated from the superconducting element, receiving the logic control pulse and transmitting heat to the superconducting element during said pulse for increasing the temperature thereof above its critical temperature and causing transition of the superconducting element from the superconducting state to the normal state, said superconducting element being structured so as to have a high resistance after such transition;

a bistable electromagnet control device receiving the logic control pulse and moving the power contacts either to their closed position or to their opened position, with a closing or opening time greater than that causing transition from the superconducting state to the normal state of the superconducting element, following such logic control pulse;

detection means for automatically detecting a fault current connected in parallel with the superconducting element, which element is adapted to transiting intrinsically from the superconducting state to the normal state in the presence of the fault current flowing therethrough;

time delayed electric control means coupled to the detection means and adapted for delivering, after a delay time of a duration at least equal to that of the logic control signal, a fault current pulse which is transmitted both to the heating element transmitting heat to the superconducting element switched intrinsically to the normal state so as to increase the resistance thereof and to the bistable electromagnetic control device moving the power contacts to their opened position at the end of the pulse.

2. Contact maker-breaker as claimed in claim 1, wherein said electric control means delivering the logic control signal are formed by a first pair of cooperating contacts urged by a control mechanism connected to the manual control member.

3. Contact maker-breaker as claimed in claim 1, wherein said bistable electromagnetic control device comprises a bistable energization coil belonging to an electromagnet, which has a mobile magnetic circuit associated with a control mechanism actuating the power contacts in their closing direction or their opening direction when said coil is energized.

4. Contact maker-breaker as claimed in claim 1, wherein said means for automatically detecting a fault current comprise an energization coil mounted electrically in parallel across the superconducting element and belonging to an electromagnet, which has a mobile magnetic circuit, and said electric control time-delayed means delivering the fault detection pulse are formed by a second pair of time delayed cooperating contacts urged in the closing direction, when the coil is energized, by a control mechanism associated with the mobile magnetic circuit.

5. Contact maker-breaker as claimed in claim 4, wherein a third pair of cooperating contacts is placed in series with the energization coil and is actuated simultaneously with the pair of power contacts by the bistable electromagnetic control device.

* * * * *